US009603269B2

(12) United States Patent
Omari et al.

(10) Patent No.: US 9,603,269 B2
(45) Date of Patent: Mar. 21, 2017

(54) MODULAR ENCLOSURE AND CONSTRUCTION METHOD

(71) Applicants:Ahmad Omari, Bayside, WI (US); Jeffrey A Kilburn, Hartland, WI (US); Jordan Rogers, Brookfield, WI (US)

(72) Inventors: Ahmad Omari, Bayside, WI (US); Jeffrey A Kilburn, Hartland, WI (US); Jordan Rogers, Brookfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 14/602,329

(22) Filed: Jan. 22, 2015

(65) Prior Publication Data

US 2016/0219729 A1 Jul. 28, 2016

(51) Int. Cl.
*H05K 5/00* (2006.01)
*H05K 5/02* (2006.01)

(52) U.S. Cl.
CPC ......... *H05K 5/0217* (2013.01); *H05K 5/0208* (2013.01)

(58) Field of Classification Search
CPC H02G 3/08; H02G 3/081; H05K 5/00; H05K 5/02; H05K 5/0217; H05K 5/0208; H05K 5/0004; H05K 5/0247; H05K 5/04; H05K 5/061; H02B 1/26; H02B 1/30
USPC ............... 174/50, 559, 17 R, 520, 560, 561; 220/3.2, 4.02; 361/600, 601, 724, 730, 361/752, 796; 312/223.1, 223.2, 265.1, 312/265.6, 265.3
See application file for complete search history.

(56) References Cited

U.S. PATENT DOCUMENTS

| | | | |
|---|---|---|---|
| 3,444,345 A | 5/1969 | Mackiewicz | |
| 4,445,622 A | 5/1984 | Sideri | |
| 5,194,691 A * | 3/1993 | McIlwraith | H05K 9/0015 361/818 |
| 5,292,189 A * | 3/1994 | Lau | H05K 7/183 312/265.3 |
| 5,536,079 A * | 7/1996 | Kostic | H02B 1/28 312/223.1 |
| 5,547,272 A | 8/1996 | Paterson et al. | |
| 5,682,017 A | 10/1997 | Marrotte | |
| 6,000,464 A * | 12/1999 | Scafidi | H05K 7/20572 361/724 |
| 6,374,912 B1 * | 4/2002 | LaGrotta | H05K 5/066 174/50 |
| 6,605,777 B1 * | 8/2003 | Anderson | H02B 1/301 174/50 |

(Continued)

*Primary Examiner* — Angel R Estrada
(74) *Attorney, Agent, or Firm* — Quarles & Brady LLP

(57) ABSTRACT

A modular enclosure configurable to achieve one of a plurality of environmental ratings is disclosed. The modular enclosure includes a base having a substantially open upper portion and a substantially open lower portion. The base further includes at least one top interlocking feature. The modular enclosure further includes a bottom cap including a bottom interlocking feature and a top cap including at least one top cap interlocking feature. The bottom cap is configured to couple to the lower portion of the base using the bottom interlocking feature and the top cap is configured to couple to the upper portion of the base using at least one top interlocking feature. The at least one top interlocking feature configured to engage a corresponding at least one top cap interlocking feature.

18 Claims, 5 Drawing Sheets

(56) References Cited

U.S. PATENT DOCUMENTS

| | | | | |
|---|---|---|---|---|
| 6,657,861 | B2* | 12/2003 | Irmer | H02B 1/50 |
| | | | | 174/383 |
| 6,877,827 | B2* | 4/2005 | Holighaus | H02B 1/30 |
| | | | | 312/223.1 |
| 6,924,572 | B2 | 8/2005 | Schmidt et al. | |
| 7,068,516 | B2 | 6/2006 | Chan et al. | |
| 7,276,659 | B2 | 10/2007 | Thrift et al. | |
| 8,148,648 | B2 | 4/2012 | Nelson et al. | |
| 8,456,814 | B2* | 6/2013 | Gerovac | H02B 1/301 |
| | | | | 174/50 |
| 8,599,540 | B2* | 12/2013 | Fernandez | H04Q 1/025 |
| | | | | 174/17 R |
| 8,802,978 | B2* | 8/2014 | Adducci | H02G 3/32 |
| | | | | 174/50 |
| 2003/0090182 | A1 | 5/2003 | Johnson | |
| 2006/0119239 | A1 | 6/2006 | Werwick | |
| 2011/0147037 | A1 | 6/2011 | Tee et al. | |
| 2014/0001932 | A1 | 1/2014 | Westby et al. | |

\* cited by examiner

MODULAR ENCLOSURE AND CONSTRUCTION METHOD

CROSS-REFERENCES TO RELATED APPLICATIONS

Not applicable.

STATEMENT REGARDING FEDERALLY SPONSORED RESEARCH

Not Applicable

BACKGROUND

The subject matter disclosed within relates generally to electrical enclosures that are used to house electrical components in industrial applications. These enclosures are generally constructed using sheet metal, and are rated based on their ability to protect the internal electrical components they are enclosing from certain environmental elements. Environmental ratings of electrical enclosures are generally defined using either the National Electrical Manufacturers Association (NEMA) standards, and/or the International Electrotechnical Commission (IEC) standard 60529, also know as IP code.

Suppliers and manufactures of electrical enclosures are often required to stock multiple enclosures of different environmental ratings. This can result in large inventories being required, and can cause poor utilization of existing inventory. Therefore, it would be desirable to avoid stocking multiple enclosures of different environmental ratings.

BRIEF SUMMARY OF THE INVENTION

The above problems can be solved by providing a modular enclosure capable of conforming to a plurality of NEMA/IP standards. Furthermore, it would be desirable to have such a modular enclosure capable of using common parts for different standards, allowing manufacturers and suppliers to carry smaller inventories and better utilize existing inventory.

In one aspect, the present invention provides a method of producing a modular electrical enclosure. The method includes determining a desired environmental rating for the modular enclosure. The modular enclosure includes a base defining an upper aperture and a lower aperture and having one or more top interlocking features. Upon determining the desired environmental rating, a bottom cap and a top cap are selected corresponding to the desired environmental rating. A selected gasket material is installed on at least one of the top cap and the bottom cap based on the desired environmental rating. The top cap is installed on the lower aperture of the base using a bottom interlocking feature and the top cap is installed on the upper aperture of the base using one or more top cap interlocking features engaging the corresponding one or more top interlocking features.

In another aspect, the present invention provides a modular enclosure configurable to achieve one of a plurality of environmental ratings. The modular enclosure includes a base having a substantially open upper portion and a substantially open lower portion. The base further includes at least one top interlocking feature. The modular enclosure further includes a bottom cap including a bottom interlocking feature and a top cap including at least one top cap interlocking feature. The bottom cap is configured to couple to the lower portion of the base using the bottom interlocking feature and the top cap is configured to couple to the upper portion of the base using at least one top interlocking feature. The at least one top interlocking feature is configured to engage a corresponding at least one top cap interlocking feature.

In yet another aspect, the present invention provides a modular enclosure configurable to achieve one of a plurality of environmental ratings. The modular enclosure includes a base defining a substantially open upper portion and a substantially open lower portion. The base includes at least one top interlocking feature adjacent to the upper portion. The modular enclosure further includes a bottom cap including a bottom plate and a bottom interlocking element configured to retain the bottom plate. The bottom interlocking element includes a base snap-in feature configured to couple the bottom cap to the lower portion of the base. The bottom interlocking element further includes a base incline surface and a base slot. The module enclosure further includes a top cap having at least one top cap interlocking feature that corresponds with at least one top interlocking feature. The top cap is configured to couple to the upper portion of the base using the at least one top interlocking feature. The at least one top interlocking feature engages the corresponding at least one top cap interlocking feature. At least one of the top cap and the bottom cap are configured to receive a selected gasket material.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF DRAWINGS

The invention will be better understood and features, aspects and advantages other than those set forth above will become apparent when consideration is given to the following detailed description thereof. Such detailed description makes reference to the following drawings.

DETAILED DESCRIPTION OF THE INVENTION

Figure 1:
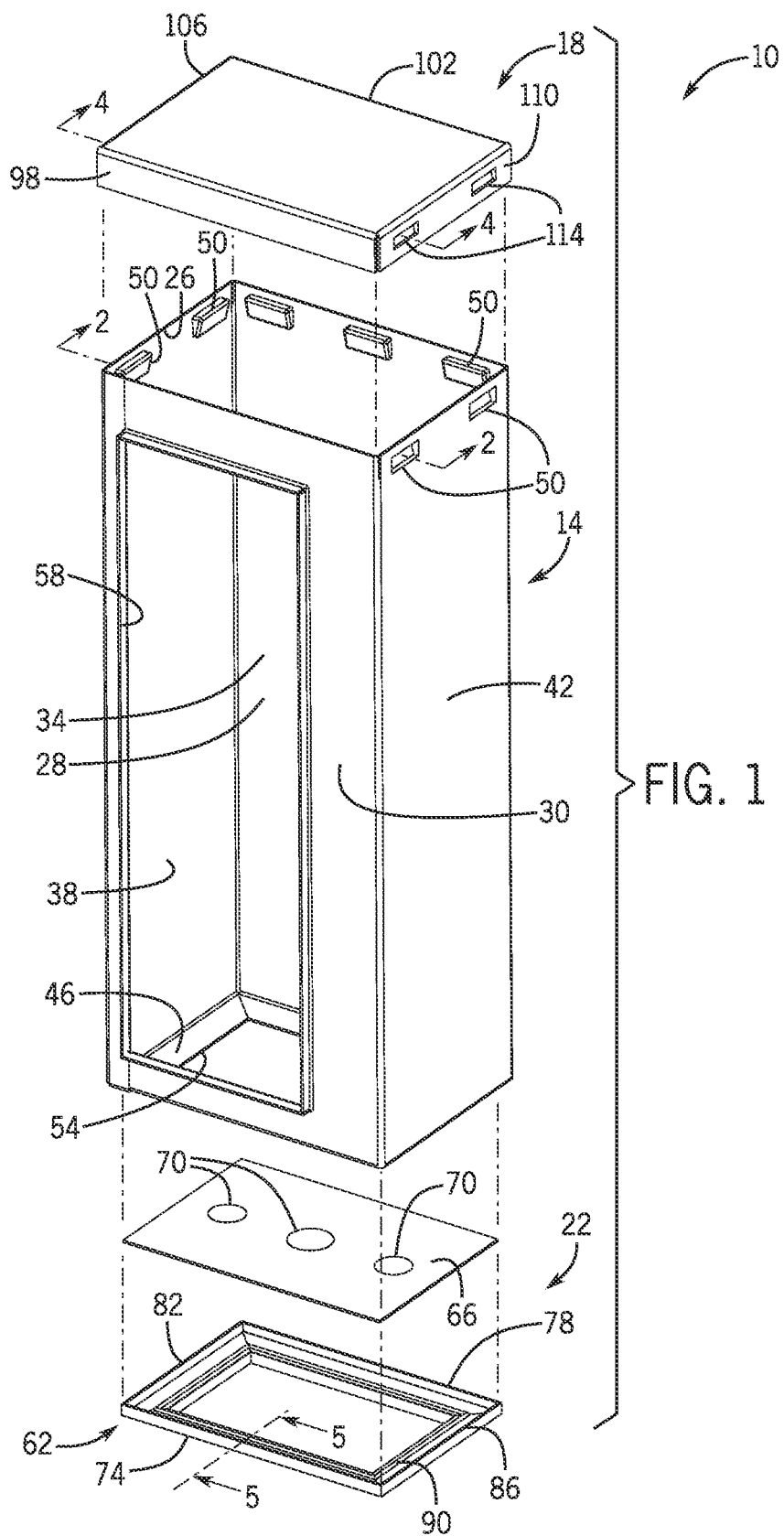
FIG. 1 is an exploded view of a modular enclosure according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the use the phraseology and terminology used herein is for the purpose of description and should not be regarded as limiting. Furthermore, the use of "right", "left", "front", "back", "upper", "lower", "above", "below", "top", or "bottom" and variations thereof herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

FIG. 1 shows a modular enclosure 10 including a base 14, a top cap 18 and a bottom cap 22. The base 14 can define a top side aperture 26, and can include, a base cavity 28, a front side 30, a back side 34, a left side 38, a right side 42, a bottom side 46, and a plurality of top interlocking features 50. Typically, electrical equipment (not shown) can be mounted adjacent to the back side 34 of the base 14 in the base cavity 28.

The base 14 can be fabricated from stainless steel. Alternatively, the base 14 could be fabricated from aluminum, plastic, an alternative steel alloy, or any suitable material known in the art. The base 14 can be manufactured by bending a sheet of stainless steel, or a sheet of an alternative material listed above, to form the front side 30, the back side 34, the left side 38, and the right side 42 and then welding the bottom side 46 onto the base 14. Alternatively, the front side 30, the back side 34, the left side 38, the right side 42, and the bottom side 46 could be separate and the base 14 could be manufactured by welding the sides (30, 34, 38, 42, 46) together. Furthermore, the base 14 could be cast using various casting methods known in the art, for example, die casting.

The bottom side 46 can define a bottom aperture 54 suitable for receiving the bottom cap 22. The front side 30 can define a door aperture 58 that may be enclosed by a door (not shown) coupled to the front side 30. The door may include a door gasket (not shown) arranged along the periphery of the door for sealing the front side 30 of the base 14 preventing the ingress of solid particles, and/or dripping water, and/or a direct stream of water into the base cavity 28. Additionally, the door could include a locking mechanism configured to prevent the door from opening, and granting a user access to the base cavity 28, when the locking mechanism is in a locked position. The locking mechanism may take the form of a latch and key, or a disconnect handle that can be configured to lock/unlock using a key or an access card. The door can be coupled to the front side 30 of the base 14 with one or more hinges, or the door could be directly bolted to the front side 30 of the base 14.

Figure 2:
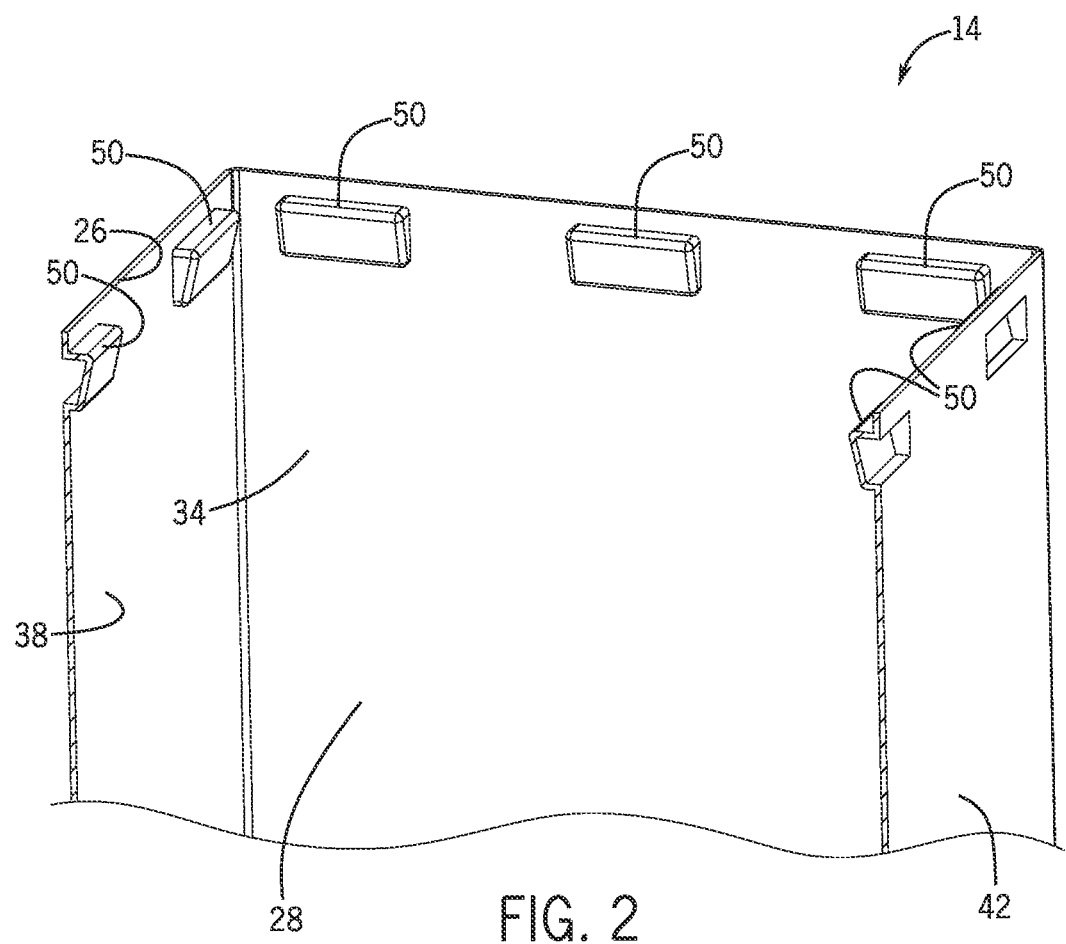
FIG. 2 is an enlarged section view of a portion of a base of the modular enclosure of FIG. 1 taken along line 1-1.

The top interlocking features 50 can define an inclined indent, shown in more detail in FIG. 2. The top interlocking features 50 could define a different indent in other embodiments. For example, the top interlocking features 50 could define an elliptical indent, or a quadrilateral indent. Alternatively, the top interlocking features 50 may take the form of a through hole for receiving a bolt or a weld stud.

The top interlocking features 50 can be integrated into the base 14 using a punching technique, where a pre-formed punch is used to form an indent in the base 14 at a desired location for the top interlocking features 50. Alternatively, the top interlocking features 50 could be individually pre-formed parts, which can be attached to the base 14 using a welding technique, or any suitable attachment means known in the art.

The top interlocking features 50 can be arranged on the front side 30 and/or the back side 34, the left side 38, the right side 42 of the base 14 at a longitudinal distance from the top side aperture 26. In the illustrated embodiment, the left side 38 and the right side 42 can include two top interlocking features 50 and the back side 34 can include three top interlocking features 50, with all the top interlocking features 50 at an equal longitudinal distance from the top side aperture 26. The quantity and arrangement of the top interlocking features 50 may be different in other embodiments. For example, one or more of the top interlocking features 50 could be arranged on the front side 30, the back side 34, the left side 38, and/or the right side 42. Alternatively, either the front side 30 and the back side 34, or the left side 38 and the right side 42 could include one or more of the top interlocking features 50. Furthermore, the longitudinal distance from the top side aperture 26 to the top interlocking features 50 may be different for one or more of the top interlocking features 50.

With continued reference to FIG. 1, the bottom cap 22 can include a bottom cap interlocking element 62 and a bottom plate 66. The bottom plate 66 can be fabricated from stainless steel. Alternatively, the bottom plate 66 could be fabricated from an aluminum, plastic, an alternative steel alloy, or any suitable material known in the art. The bottom plate 66 can include a plurality of gland apertures 96 that may be used to mount cable glands for cable routing, although the bottom plate may include a single gland aperture or no gland apertures in other embodiments. Alternatively, the bottom plate 66 could include mounting provisions for electrical equipment such as pilot operators, emergency stops, or disconnect switches.

In the illustrated embodiment, the plurality of gland apertures 70 can define a substantially round shape. In other embodiments, the plurality of gland apertures can define an alternative shape, as desired. For example, the plurality of gland apertures may define a substantially rectangular shape.

The bottom cap interlocking element 62 can be configured to define the bottom plate 66 and can include a bottom cap front side 74, a bottom cap back side 78, a bottom cap left side 82, a bottom cap right side 86. The bottom cap interlocking element 62 can also include a bottom plate gasket 90. The bottom plate gasket 90 can provide a seal between the bottom plate 66 and the bottom cap interlocking element 62 preventing the ingress of solid particles, dripping water, and/or a direct stream of water past the bottom plate gasket 90.

The bottom plate gasket 90 can be fabricated from a silicone based foam sealing material. In other embodiments, the bottom plate gasket 90 could be fabricated from an alternative sealing material such as polyurethane, polyvinyl chloride, polyethylene, rubber, metal, graphite, or any suitable sealing material known in the art. In one embodiment, the bottom plate gasket 90 can be attached to the bottom cap interlocking element 62 using a foam-in-place technique. In other embodiments, the bottom plate gasket 90 may be attached to the bottom cap interlocking element 62 using an adhesive, for example, a peel-and-stick method or a glue may be used. In still other embodiments, the bottom plate gasket 90 may be mechanically coupled to the bottom cap interlocking element 62 using a groove or a slot to secure the bottom plate gasket 90 in place.

Figure 3:
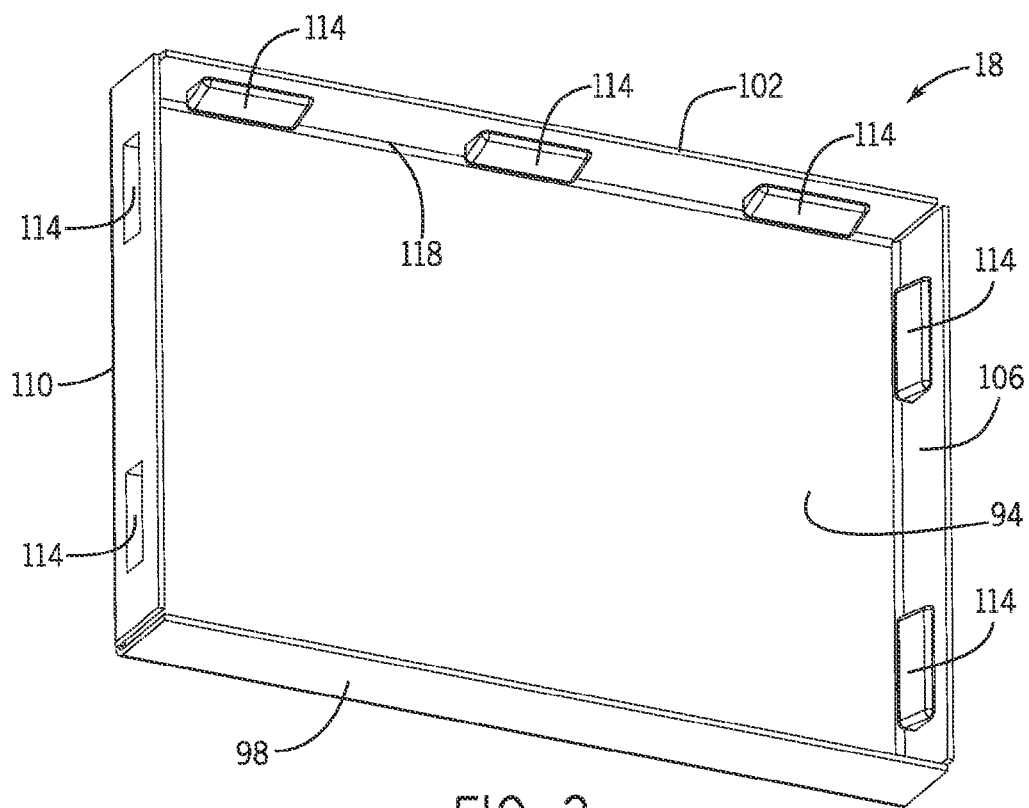
FIG. 3 is a bottom view of a top cap of the modular enclosure of FIG. 1.

Referring to FIG. 1 and FIG. 3, the top cap 18 can include a top cap inner surface 94, a top cap front side 98, a top cap back side 102, a top cap left side 106, a top cap right side 110, a plurality of top cap interlocking features 114, and a top cap gasket 118. The top cap front side 98, the top cap back side 102, the top cap left side 106, and the top cap right side 110 can be arranged substantially perpendicular to the top cap inner surface 94. In other embodiments, the top cap front side 98, the top cap back side 102, the top cap left side 106 and/or the top cap right side 110 may be arranged at a different angle relative to the top cap inner surface 94, as desired.

The top cap 18 can be fabricated from stainless steel. Alternatively, the top cap 18 could be fabricated from aluminum, plastic, or an alternative steel alloy. The top cap 18 can be manufactured by bending a sheet of stainless steel to form the top cap inner surface 94, the top cap front side 98, the top cap back side 102, the top cap left side 106, and the top cap right side 110. Alternatively, the top cap 18 could be formed using a punching technique with a pre-formed punch, or the top cap 18 could be cast using various casting methods know in the art, for example, die casting. Furthermore, the top cap inner surface 94, the top cap front side 98, the top cap back side 102, the top cap left side 106, and the top cap right side 110 could be separate and the top cap 18 could be manufactured by welding the sides (94, 98, 102, 106, 110) together. It should be known that the top cap 18 does not need to be fabricated from the same material as the base 14 and/or the bottom plate 66 and/or the bottom cap interlocking element 62.

Figure 4:
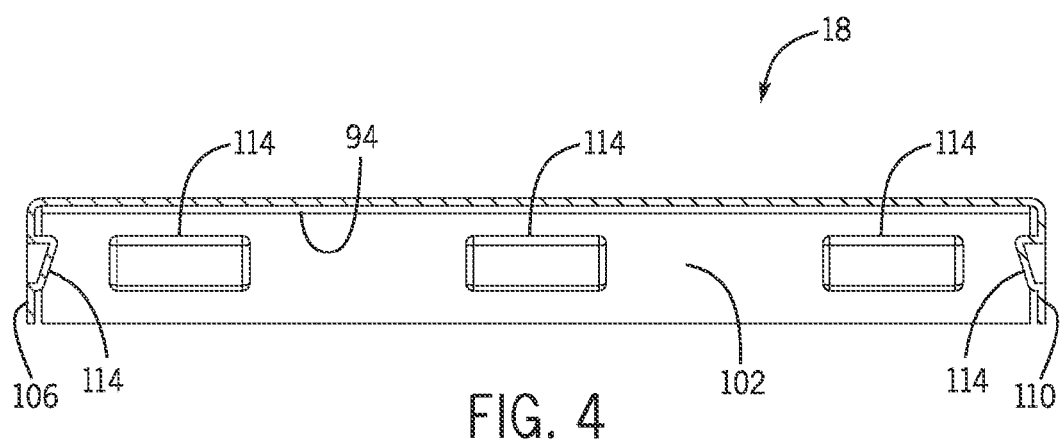
FIG. 4 is a section view of the top cap of the modular enclosure of FIG. 1 taken along line 2-2.

The top cap interlocking features 114 can define an inclined protrusion, shown in cross-section in FIG. 4. The top cap interlocking features 114 can define a different protrusion in other embodiments. For example, the top cap interlocking features 114 could define an elliptical protrusion, or a quadrilateral protrusion. Alternatively, top cap interlocking features 114 may take the form of a through hole for receiving a bolt or a weld stud that interface with corresponding top interlocking features 50 in the form of a though hole on the base 14 of the modular enclosure 10. The bolt or weld stud could then be used as a fastening means to interlock the top cap 18 and the base 14.

The top cap interlocking features 114 can be integrated into the top cap 18 using punching technique, where a pre-formed punch is used to form a protrusion in the top cap 18 at a desired location for the top cap interlocking features 114. Alternatively, the top cap interlocking features 114 could be individually pre-formed parts and attached to the top cap 18 using a welding technique, or any suitable attachment means known in the art. The top cap interlocking features 114 could be formed into the top cap 18 before or after the top cap 18 is formed.

The top cap interlocking features 114 can be arranged on the top cap back side 102, the top cap left side 106, and the top cap right side 110 at a longitudinal distance from the top cap inner surface 94. In the illustrated embodiment, the top cap left side 106 and the top cap right side 110 can include two top cap interlocking features 114 and the top cap back side 102 can include three top cap interlocking features 114, with all the top cap interlocking features 114 at an equal longitudinal distance from the top cap inner surface 94. The quantity and arrangement of the top cap interlocking features 114 may be different in other embodiments. For example, one or more of the top cap interlocking features 114 could be arranged on the top cap front side 98, the top cap back side 102, the top cap left side 106, and/or the top cap right side 110. Alternatively, either the top cap front side 98 and the top cap back side 102 or the top cap left side 106 and the top cap right side 110 could include one or more of the top cap interlocking features 114. Furthermore, the longitudinal distance from the top cap inner surface 94 may be different for one or more of the top cap interlocking features 114.

The top cap gasket 118 can be generally arranged around the periphery of the top cap inner surface 94. The top cap gasket can provide a seal between the top side aperture 26 and the top cap inner surface 94 preventing the ingress of solid particles, dripping water, and/or a direct stream of water past the top cap gasket 118. In one embodiment, the top cap gasket 118 could be arranged within the top cap 18 on the top cap front side 98, the top cap back side 102, the top cap left side 106, and the top cap right side 110. In another embodiment, the top cap gasket 118 could be arranged on the front side 30, the back side 34, the left side 38, the right side 42 of the base 14 adjacent to the top side aperture 26.

The top cap gasket 118 can be fabricated from a silicone based foam sealing material. In other embodiments, the top cap gasket 118 could be fabricated from an alternative sealing material such as polyurethane, polyvinyl chloride, polyethylene, rubber, metal, graphite, or any suitable sealing material known in the art. In one embodiment, the top cap gasket 118 can be attached to the top cap inner surface 94 using a foam-in-place technique. In other embodiments, the top cap gasket 118 may be attached to the top cap inner surface 94 using an adhesive, for example, a peel-and-stick method or a glue may be used. In still other embodiments, the top cap gasket 118 may be mechanically coupled to the top cap inner surface 94 using a groove or a slot to secure the top cap gasket 118 in place.

Figure 5:
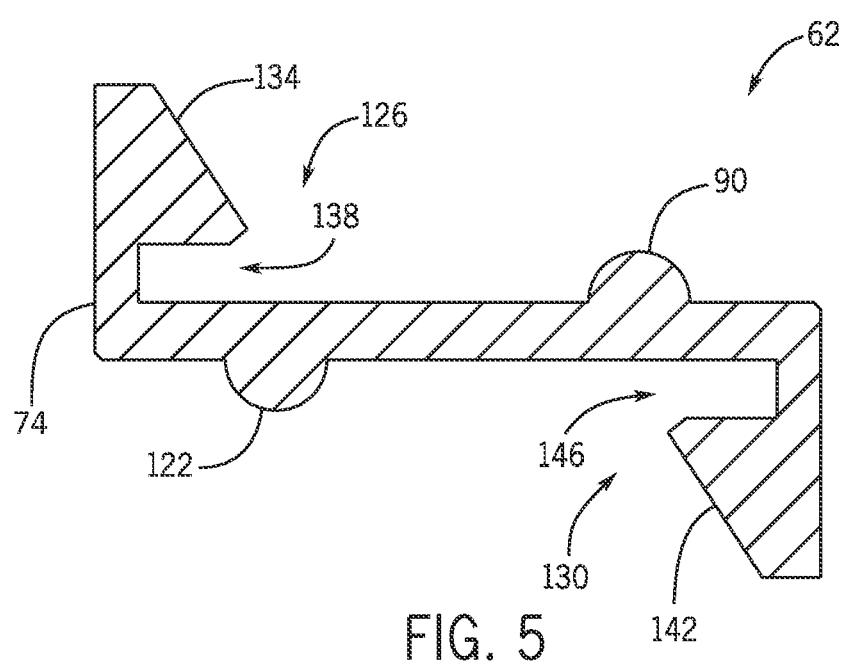
FIG. 5 is section view of a bottom cap interlocking element of the modular enclosure of FIG. 1 taken along line 3-3.

Referring to FIG. 5, the bottom cap interlocking element 62 can be seen in a sectional view showing a base gasket 122. The base gasket 122 can provide a seal between the bottom side 46 of the base 14 and the bottom cap interlocking element 62 preventing the ingress of solid particles, dripping water, and/or a direct stream of water past the base gasket 122. The base gasket 122 can be fabricated from a silicone based foam sealing material. In other embodiments, the base gasket 122 could be fabricated from an alternative sealing material such as polyurethane, polyvinyl chloride, polyethylene, rubber, metal, graphite, or any suitable sealing material known in the art. In one embodiment, the base gasket 122 can be attached to the bottom cap interlocking element 62 using a foam-in-place technique. In other embodiments, the base gasket 122 may be attached to the bottom cap interlocking element 62 using an adhesive, for example, a peel-and-stick method or a glue may be used. In still other embodiments, the base gasket 122 may be mechanically coupled to the bottom cap interlocking element 62 using a groove or a slot to secure the base gasket 122 in place.

Also shown in FIG. 5, the bottom cap interlocking element 62 further includes a bottom plate snap-in feature 126 arranged on the periphery of the bottom cap interlocking element 62, and a base snap-in feature 130 arranged laterally inward from the periphery of the bottom cap interlocking element 62. In other embodiments, the bottom cap interlocking element 62 may include a plurality of snap-in elements configured to frame a plurality of bottom plate shapes and sizes. For example, the illustrated bottom cap interlocking element 62 may comprise four snap-in elements. Additionally, a viable sealing material or method may be used to seal a plurality of mating surfaces on the snap-in elements.

The bottom cap interlocking element 62 can be fabricated from a plastic material. Alternatively, the bottom cap interlocking element could be fabricated from a rubber, metal, fiberglass, or graphite material. The bottom cap interlocking element 62 can be manufactured using an injection molding procedure. In other embodiments, the bottom cap interlocking element 62 can be manufactured using a casting procedure or any viable procedure known in the art.

The bottom plate snap-in feature 126 can include a bottom plate incline surface 134 and a bottom plate slot 138. The bottom plate slot 138 can be arranged adjacent to the bottom plate incline surface 134. The bottom plate snap-in feature 126 can be configured to interlock the bottom plate 66 and the bottom cap interlocking element 62. This interlocking can occur by seating the bottom plate 66 within the bottom plate slot 138 thereby inhibiting the bottom plate 66 from displacing relative to the bottom cap interlocking element 62.

The base snap-in feature 130 can include a base incline surface 142 and a base slot 146. The base slot 146 can be arranged adjacent to the base incline surface 142. The base snap-in feature 130 can be configured to interlock the bottom side 46 of the base 14 and the bottom cap interlocking element 62. This interlocking can occur by seating the bottom side of the base 14 within the base slot 146 thereby inhibiting the bottom side of the base 14 to displace relative to the bottom cap interlocking element 62. In other embodiments, the bottom plate snap-in feature 126 and/or the base snap-in feature 130 may be configured to provide an interlocking means using any suitable technique known in the art.

Assembly of the modular enclosure will be described with reference to FIG. 1, FIG. 3, FIG. 5, FIG. 6, and FIG. 7. The top cap 18 can be installed onto the base 14 by first arranging the top cap 18 over the top side aperture 26 of the base 14 with the front side 30 of the base 14 substantially parallel to the top cap front side 98. The top cap 18 can then be moved forceably onto the base 14 by applying a downward force onto the top cap 18 until the inclined protrusion of the top cap interlocking features 114 engage the inclined indent of the corresponding top interlocking features 50. Alternatively, the base 14 could be moved forceably into the top cap 18 by applying an upward force onto the base 14.

Once the inclined protrusion of the top cap interlocking features 114 engage the inclined indent of the top interlocking features 50, the top cap 18 can be inhibited from displacing relative to the base 14, thereby interlocking the top cap 18 and the base 14. Ideally, all of the top cap interlocking features 114 would be in engagement with the corresponding top interlocking features 50. However, for the top cap 18 to be interlocked to the base 14 only two of the top cap interlocking features 114 on opposite sides of the base 14 need to engage two of the corresponding top interlocking features 50. As described above, the top cap 18 and the base 14 may be interlocked using any suitable technique known in the art. For example, a through hole and a bolt or a weld stud may be used. Alternatively, the top cap 18 may not include the top cap interlocking features 114 and/or the base 14 may not include the top interlocking features 50, and the top cap 18 could be welded onto the base 14.

When the top cap 18 is installed onto the base 14, the top side aperture 26 of the base 14 can compress the top cap gasket 118 providing a sealing engagement between the top side aperture 26 and the top cap 18. This sealing engagement can prevent the ingress of solid particles, dripping water, and/or a direct stream of water past the top cap gasket 118 and into the base cavity 28.

Figure 6:
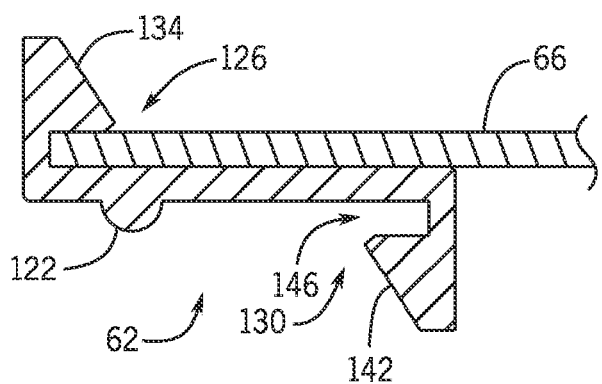
FIG. 6 is a section view of the bottom cap interlocking element of FIG. 5 and a bottom plate.

The bottom cap 22 can be assembled by first placing the bottom plate 66 onto the bottom cap interlocking element 62 so that the bottom plate 66 engages the bottom plate incline surface 134. The bottom plate 66 can then be moved forceably towards the bottom plate slot 138 until it travels past the bottom plate incline surface 134 and seats within the bottom plate slot 138, as shown in FIG. 6. When the bottom plate 66 is seated within the bottom plate slot 138, the bottom plate 66 can be inhibited from displacing relative to the bottom cap interlocking element 62, thereby interlocking the bottom cap interlocking element 62 and the bottom plate 66. Additionally, the bottom plate 66 can compress the bottom plate gasket 90 providing a sealing engagement between the bottom cap interlocking element 62 and the bottom plate 66. This sealing engagement can prevent the ingress of solid particles, dripping water, and/or a direct stream of water from ingressing into the base cavity 28 through the bottom plate gasket 90.

Figure 7:
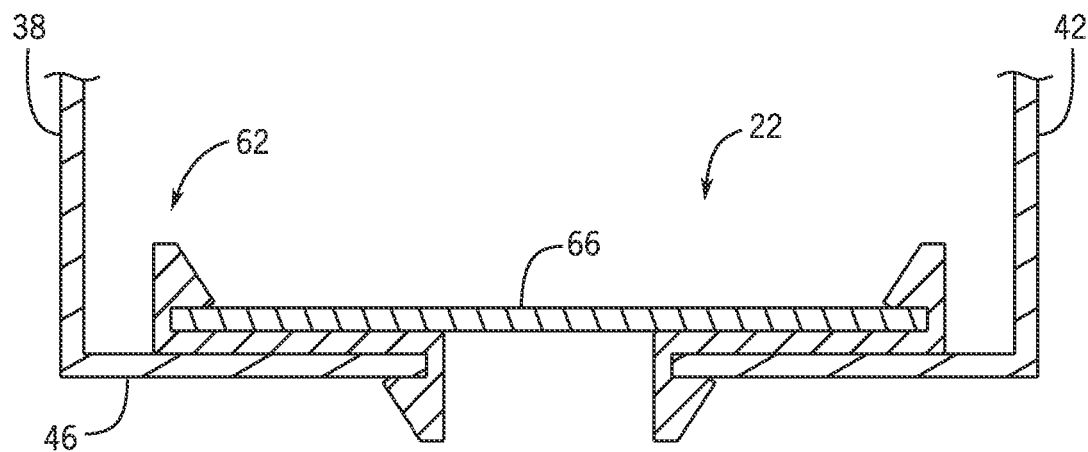
FIG. 7 is a section view of a bottom cap installed onto the modular enclosure of FIG. 1.

The bottom cap 22 can be installed onto the base 14 by first placing the bottom cap 22 within the base cavity 28 such that the bottom cap front side 74 is arranged substantially parallel to the front side 30 of the base 14, and the base incline surface 142 is facing the bottom side 46 of the base 14. Next, the bottom cap 22 can be placed onto the bottom side 46 of the base 14, so the base incline surface 142 engages and covers the bottom aperture 54. The bottom cap 22 can then be moved forceably onto the bottom side 46 of the base 14 by applying a downward force on the bottom plate 66 or the bottom cap interlocking element 62 until the bottom side 46 travels past the base incline surface 142 and seats within the base slot 146, as shown in FIG. 7. When the bottom side 46 of the base 14 is seated within the base slot 146, the bottom cap 22 can be inhibited from displacing relative to the base 14, thereby interlocking the bottom cap 22 and the base 14. Additionally, the bottom side 46 of the base 14 can compress the base gasket 122 providing a sealing engagement between the bottom cap 22 and the base 14. This sealing engagement can prevent the prevent the ingress of solid particles, dripping water, and/or a direct stream of water past the base gasket 122 and into the base cavity 28.

Alternatively, the bottom cap 22 may also be installed onto the base by first installing the bottom cap interlocking element 62 onto the bottom side 46 of the base 14, and then installing the bottom plate 66 onto the bottom cap interlocking element 62.

When the modular enclosure 10 is assembled, it may be intended for either indoor or outdoor use and can provide a degree of protection to a person working near the modular enclosure 10 against access to internal parts. Additionally, the modular enclosure 10 can provide a degree of protection to the electrical equipment against the ingress of solid foreign objects from falling dirt and windblown dust, and the ingress of water from rain, sleet, snow, splashing water, and hose directed water. Furthermore, the modular enclosure 10 could be undamaged by the external formation of ice on the modular enclosure 10. These protection features qualify the modular enclosure 10 to conform to environmental ratings NEMA 4, or IP66.

Alternatively, the modular enclosure 10 may be intended for indoor use and could provide a degree of protection to a person working near the modular enclosure 10 against access to internal parts. Additionally, the modular enclosure 10 could provide a degree of protection to the electrical equipment against the ingress of solid foreign objects from falling dirt and circulating dust, lint, fibers, and flyings. Furthermore, the modular enclosure 10 could provide a degree of protection to the electrical equipment against the ingress of water from dripping and light splashing of liquids. These protection features qualify the modular enclosure 10 to conform to environmental ratings NEMA 12, or IP54.

In another embodiment, the modular enclosure 10 may be intended for either indoor or outdoor use and the bottom cap interlocking element 62 may not include the base gasket 122. A modular enclosure 10 assembled, as described above, with this embodiment of the bottom cap interlocking element 62 may not protect the electrical equipment from the ingress of water from splashing water and directed hose water. However, the modular enclosure 10 may provide a degree of protection to the electrical equipment from the ingress of water from rain, sleet, and snow, and the ingress of solid foreign objects from falling dirt. Additionally, the modular enclosure 10 could provide a degree of protection to a person working near the modular enclosure 10 against access to internal parts. These protection features qualify the modular enclosure 10 to conform to environmental ratings NEMA 3R or IP24.

In yet another embodiment, the modular enclosure 10 may be intended for indoor use and the top cap 18 may not include the top cap gasket 118 and the bottom cap interlocking element 62 may not include the base gasket 122. A modular enclosure 10 assembled, as described above, with no top cap gasket 118 on the top cap 18 and no base gasket 122 on the bottom cap interlocking feature 90 may not protect against the ingress of any water. However, the modular enclosure 10 may provide a degree of protection to the electrical equipment from the ingress of solid foreign objects from falling dirt. Additionally, the modular enclosure 10 could provide a degree of protection to a person working near the modular enclosure 10 against access to internal parts. These protection features qualify the modular enclosure 10 to conform to environmental ratings NEMA 1, or IP20.

The modular enclosure 10 described herein provides the advantage of being configurable to comply with a plurality of environmental ratings by including a plurality of top cap 18 and bottom cap 22 arrangements that can be installed onto the base 14. While the top cap 18 and the bottom cap 22 may change, the base 14 can be common to all of the arrangements and can allow suppliers and manufacturers of the modular enclosure 10 to carry a smaller inventory and better utilize existing inventories. For example, a supplier or manufacturer of the modular enclosure 10 can stock one base 14 and the plurality of top cap 18 and bottom cap 22 arrangements to fulfill an order for a NEMA 1, 3R, 4, or 12 conforming enclosure. Alternatively, a supplier or manufacturer of non-modular enclosures could have to stock one of each of a NEMA 1, 3R, 4, and 12 conforming enclosure in order to fulfill the same order as the supplier or manufacturer of the modular enclosure 10. Additionally, if such an order was requested, the supplier or manufacturer of the non-modular enclosure could be depleted of their supply of that specific environmental conforming enclosure.

Therefore, the supplier or manufacturer of the modular enclosure 10 can carry less parts while maintaining the ability to supply enclosures conforming to a plurality of environmental ratings. Additionally, the supplier or manufacturer of the modular enclosure 10 can better adjust to fluctuating supply and/or demand by using common parts when configuring the modular enclosure 10 to conform to a plurality of environmental ratings.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto.

We claim:

1. A modular enclosure configurable to achieve one of a plurality of environmental ratings, comprising:
   a base, the base having a substantially open upper portion and a substantially open lower portion, the base further including at least one top interlocking feature;
   a bottom cap, the bottom cap including a bottom interlocking feature, the bottom interlocking feature including a base snap-in feature configured to couple the bottom cap to the lower portion of the base, the bottom interlocking feature further including a base incline surface defining a base slot sized to receive the base;
   a top cap, the top cap including at least one top cap interlocking feature; and
   the bottom cap configured to couple to the lower portion of the base using the bottom interlocking feature and the top cap configured to couple to the upper portion of the base using the at least one top interlocking feature, the at least one top interlocking feature configured to engage a corresponding at least one top cap interlocking feature.

2. The modular enclosure of claim 1, wherein the top cap includes a top cap gasket.

3. The modular enclosure of claim 2, wherein the modular enclosure conforms to at least one of National Electrical Manufacturers Association 1 and National Electrical Manufacturers Association 3R enclosure type standards.

4. The modular enclosure of claim 2, wherein the bottom cap includes a base gasket.

5. The modular enclosure of claim 4, wherein the modular enclosure conforms to at least one of National Electrical Manufacturers Association 4 and National Electrical Manufacturers Association 12 enclosure type standards.

6. The modular enclosure of claim 1, wherein the bottom cap includes a bottom plate and the bottom interlocking feature further includes a bottom plate snap-in feature configured to couple the bottom plate to the bottom cap, a bottom plate incline surface, and a bottom plate slot.

7. A modular enclosure configurable to achieve one of a plurality of environmental ratings, comprising:
   a base, the base defining a substantially open upper portion and a substantially open lower portion and including at least one top interlocking feature adjacent to the upper portion;

a bottom cap, the bottom cap including a bottom plate and a bottom interlocking element configured to retain the bottom plate;

the bottom interlocking element including a base snap-in feature configured to couple the bottom interlocking element to the lower portion of the base, the base snap-in feature including a base incline surface defining a base slot sized to receive the base;

a top cap, the top cap including at least one top cap interlocking feature, the at least one top cap interlocking feature corresponding with the at least one top interlocking feature;

the top cap configured to couple to the upper portion of the base using the at least one top interlocking feature, the at least one top interlocking feature engaging the corresponding at least one top cap interlocking feature; and wherein at least one of the top cap and the bottom cap are configured to receive a selected gasket material.

8. The modular enclosure of claim 7, wherein the top cap includes a top cap gasket and the bottom cap includes a base gasket.

9. The modular enclosure of claim 7, wherein the bottom interlocking element further includes a bottom plate snap-in feature configured to couple the bottom interlocking element to the bottom plate, the bottom plate snap-in feature including a bottom plate incline surface defining a bottom plate slot sized to receive the bottom plate.

10. A method of producing a modular electrical enclosure, the method comprising:

determining a desired environmental rating for the modular electrical enclosure, the modular electrical enclosure comprising a base defining an upper aperture and a lower aperture and including one or more top interlocking features;

selecting a bottom cap and a top cap corresponding to the desired environmental rating;

installing a selected gasket material on at least one of the top cap and the bottom cap based on the desired environmental rating;

installing the bottom cap on the lower aperture of the base using a bottom interlocking feature, the bottom interlocking feature including a base snap-in feature configured to couple the bottom cap to the lower aperture of the base, the bottom interlocking feature further including a base incline surface defining a base slot sized to receive the lower aperture of the base; and installing the top cap on the upper aperture of the base using one or more top cap interlocking features engaging the corresponding one or more top interlocking features.

11. The method of claim 10, wherein installation of the selected gasket material on the top cap only enables the modular enclosure to conform to National Electrical Manufacturers Association 3R enclosure type standard.

12. The method of claim 10, wherein installation of the selected gasket material on the top cap and the bottom cap enables the modular enclosure to conform at least one of National Electrical Manufacturers Association 4 and National Electrical Manufacturers Association 12 enclosure type standards.

13. The method of claim 10, wherein the selected gasket material is a silicone base foam.

14. The method of claim 10, wherein the one or more top interlocking features define one or more indents in the base adjacent to the upper aperture.

15. The method of claim 14, wherein the one or more indents define a substantially inclined shape.

16. The method of claim 10, wherein the one or more top cap interlocking features define one or more protrusions in the top cap.

17. The method of claim 16, wherein the one or more protrusions define a substantially inclined shape.

18. The method of claim 10, wherein the bottom cap includes a bottom plate and the bottom interlocking feature further includes a bottom plate snap-in feature configured to couple the bottom plate to the bottom cap, a bottom plate incline surface, and a bottom plate slot.

* * * * *